(12) United States Patent
Kim

(10) Patent No.: US 6,225,847 B1
(45) Date of Patent: *May 1, 2001

(54) COMPLEMENTARY CLOCK GENERATOR AND METHOD FOR GENERATING COMPLEMENTARY CLOCKS

(75) Inventor: Dae-Jeong Kim, Seoul (KR)

(73) Assignee: LG Semicon Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/187,354

(22) Filed: Nov. 6, 1998

Related U.S. Application Data

(63) Continuation of application No. 08/774,825, filed on Dec. 27, 1996, now Pat. No. 5,867,043.

(30) Foreign Application Priority Data

Dec. 30, 1995 (KR) .................................................. 95-69662

(51) Int. Cl.⁷ ....................................................... H03K 3/00
(52) U.S. Cl. ........................... 327/257; 327/295; 327/259
(58) Field of Search .................................. 327/231, 239, 327/242, 256, 257, 258, 259, 295, 365, 404, 415, 416

(56) References Cited

U.S. PATENT DOCUMENTS

| | | | |
|---|---|---|---|
| 4,494,021 | * 1/1985 | Bell et al. | 327/259 |
| 5,418,407 | * 5/1995 | Fenkil et al. | 327/333 |
| 5,867,043 | * 2/1999 | Kim | 327/259 |

* cited by examiner

*Primary Examiner*—Dinh T. Le
(74) *Attorney, Agent, or Firm*—Loudermilk & Associates

(57) ABSTRACT

A complementary clock generator and a method for generating complementary clocks are disclosed. A complementary clock generator according to the present invention includes a first inverter, a first transmitting switch and a second transmitting switch. The first inverter outputs inverted clock signals by inverting input clock signals. The first transmitting switch has an input terminal, an output terminal, a first control input terminal and a second control input terminal, and connects the input terminal to the output terminal when the input clock signal reaches the first control input terminal and the inverted clock signal from the first inverter reaches the second control input terminal. The second transmitting switch has an input terminal, an output terminal, a first control input terminal and a second control input terminal, and connects the input terminal to the output terminal when the inverted clock signal from the first inverter reaches the first control input terminal and the input clock signal reaches the second control input terminal, wherein same-phase clock signals are obtained from the output terminal of the first transmitting switch, and opposite-phase clock signals are obtained from the output terminal of the second transmitting switch.

10 Claims, 4 Drawing Sheets

COMPLEMENTARY CLOCK GENERATOR AND METHOD FOR GENERATING COMPLEMENTARY CLOCKS

The present application is a continuation of App. Ser. No. 08/774,825, filed on Dec. 27, 1996, U.S. Pat. No. 5,867,043, being hereby incorporated by referenced in its entirety.

FIELD OF THE INVENTION

The present invention relates to complementary clock generators and methods for generating complementary clocks, and more particularly the present invention relates to a CMOS complementary clock generator and a method for generating complementary clocks in which a crossing point less sensitive to variations in process, temperature and supply voltage is provided.

BACKGROUND OF THE INVENTION

In many digital electronic circuits, complementary clock signals having a mutually inverse relationship are required. Because the operating speed of the electronic circuits gradually increases, clock signals having an exactly inverse relation in the time axis are required.

As illustrated in FIG. 1A, a conventional CMOS complementary clock generator for generating complementary clocks includes: a same-phase path having two serially connected CMOS inverters Inv1 and Inv2 for outputting a clock signal with a phase the same as that of an input clock; and an opposite-phase path having three serially-connected CMOS inverters Inv3, Inv4 and Inv5 for outputting a clock signal with a phase opposite to that of the input clock. The same-phase path is formed by serially connecting an even number of inverters, while the opposite-phase path is formed by serially connecting an odd number of inverters.

As illustrated in FIG. 1B, each of CMOS inverters Inv1, Inv2, Inv3, Inv4 and Inv5 is constituted such that PMOS transistor MP1 and NMOS transistor MN1 are serially connected, with the gates of PMOS transistor MP1 and NMOS transistor MN1 connected to receive an input signal, and an output is outputted through a connection point of the sources and drains of the transistors as illustrated.

This circuit operates in the following manner. For example, if input clock signal Clkin has pulses with a duty cycle of 50%, same-phase output clock signal Clk, with pulses having passed through the same-phase path, i.e., inverters Inv1 and Inv2, have the same phase as that of the input clock, while opposite-phase output clock signal /Clk, with pulses having passed through the opposite-phase path, i.e., inverters Inv3, Inv4 and Inv5, have a phase opposite to that of the input clock. Therefore, the clocks have a duty cycle of 50%, and they cross each other at a point of 50%.

If precise complementary clocks having opposite phases at the same timing point are to be formed, the delay of the same-phase path and the opposite-phase path has to be the same, and the number of the inverters of the opposite-phase path has to be larger than that of the inverters of the same-phase path by one. Therefore, the size of the inverters of the opposite-phase path is made to be larger than that of the inverters of the same-phase path, so that the delay of each of the inverters of the opposite-phase path would be smaller than the delay of each of the inverters of the same-phase path. Thus the total delay required in passing through the opposite-phase path is made to be same as the total delay required in passing through the same-phase path.

Generally, the loads of clock signals Clk and /Clk are the same, and the inverters of the opposite-phase path are designed to be bigger than the inverters of the same-phase path. Due to instability of the manufacturing process, the actual sizes of the CMOS inverters are not exactly formed as designed, but instead deviate from the intended design. Therefore, the ratios of the channel widths to the channel lengths of the transistors, i.e., W/L ratios, become different from the intended design. Further, the delay varies in accordance with variations of operating temperature, and, therefore, even if the two paths are matched in the normal operation, the delay can become different if the operating conditions are even slightly different.

As a result, viewed from the time axis, the two complementary clocks are not exactly of an opposite relation, but instead one of them lags behind the other, thereby forming a varying wave pattern. This phenomenon occurs frequently. Further, under certain operating conditions, after maintaining an exactly opposite relationship, if the operating conditions vary even slightly, then a deviating wave pattern is produced.

The basic cause for this phenomenon is as follows. The circuit elements forming the two paths of the same and opposite phases are asymmetrically provided. That is, in the case of the same-phase path, two (or an even number of) inverters form the signal transfer path, while in the case of the opposite-phase path, three (or an odd number of) inverters form the signal transfer path. That is the two paths pass through different kinds of transistors or different numbers of transistors.

SUMMARY OF THE INVENTION

The present invention is intended to overcome the above-described disadvantages of the conventional technique.

Therefore it is an object of the present invention to provide a complementary clock generator and a method for generating complementary clocks, in which complementary clocks of exactly opposite phases can be obtained viewed from the time axis.

In the present invention, the complementary clock signals of more exactly opposite phases with more exact timing may be obtained by providing that the same-phase path and the opposite-phase path are composed of the same kinds and same numbers of circuit elements, and thus when the signals pass through the two paths, the delays are made to be more precisely the same.

In achieving the above object, a complementary clock generator according to the present invention includes: a first inverter for outputting inverted clock signals by inverting input clock signals; a first transmitting switch having an input terminal, an output terminal, a first control input terminal and a second control input terminal, for connecting the input terminal to the output terminal when the input clock signal reaches the first control input terminal, and when the inverted clock signal of the first inverter reaches the second control input terminal; and a second transmitting switch having an input terminal, an output terminal, a first control input terminal and a second control input terminal, for connecting the input terminal to the output terminal when the inverted clock signal of the first inverter reaches the first control input terminal, and when the input clock signal reaches the second control input terminal, whereby same-phase clock signals may be obtained from the output terminal of the first transmitting switch, and opposite-phase clock signals may be obtained from the output terminal of the second transmitting switch.

In order to obtain a sufficient voltage for driving the load, a second inverter is connected to the output terminal of the first transmitting switch, and a third inverter is connected to the output terminal of the second transmitting switch.

Each of the first and second transmitting switches may include: a first PMOS transistor, a first NMOS transistor, a second PMOS transistor, and a second NMOS transistor connected in series; drains of the first PMOS transistor and the second NMOS transistor being connected together so as to serve as an output terminal; gates of the first NMOS transistor and the second PMOS transistor being connected together so as to serve as the first control input terminal; sources of the first NMOS transistor and the second PMOS transistor being connected together so as to serve as the input terminal; and gates of the first PMOS transistor and the second NMOS transistor being connected together so as to serve as the second control input terminal.

In another aspect of the present invention, a method for generating complementary clocks such as same-phase clock signal signals and opposite-phase clock signals from an input clock signal according to the present invention, includes the steps of: inverting an input clock signal to form an inverted clock signal, and supplying input clock signals to two paths which allow signal transmissions at a moment when the input clock signal and the inverted clock signal are simultaneously supplied, so as to make a part of the paths ready; and making the inverted clock signal and the input clock signal pass through the two paths which allows signal transmissions at a moment when the input clock signal and the inverted clock signal are simultaneously supplied, wherein complementary signals having a more exact opposite phase relationship are generated with a more exact timing.

DESCRIPTION OF THE DRAWINGS

The above objects and other advantages of the present invention will become more apparent by describing in detail the preferred embodiments of the present invention with reference to the attached drawings in which.

DESCRIPTION OF THE PREFERRED EMBODIMENTS

Figure 1A:
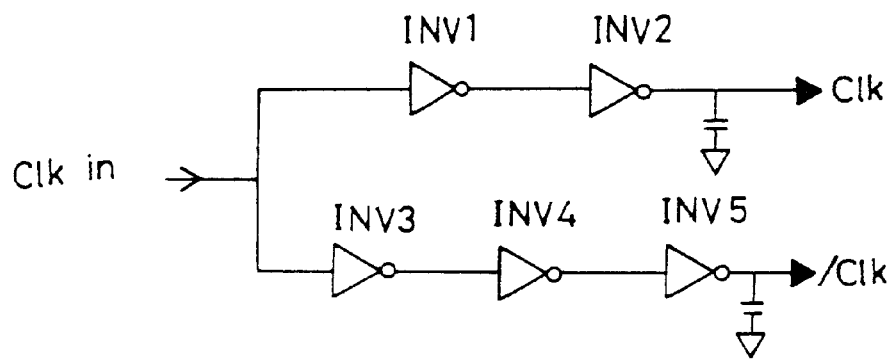
FIGS. 1A and 1B illustrate circuits of a conventional CMOS complementary clock generator.
Figure 1B:
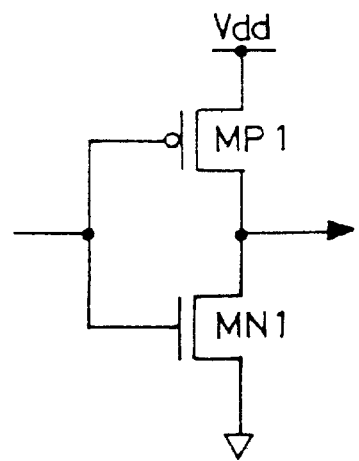
Figure 2:
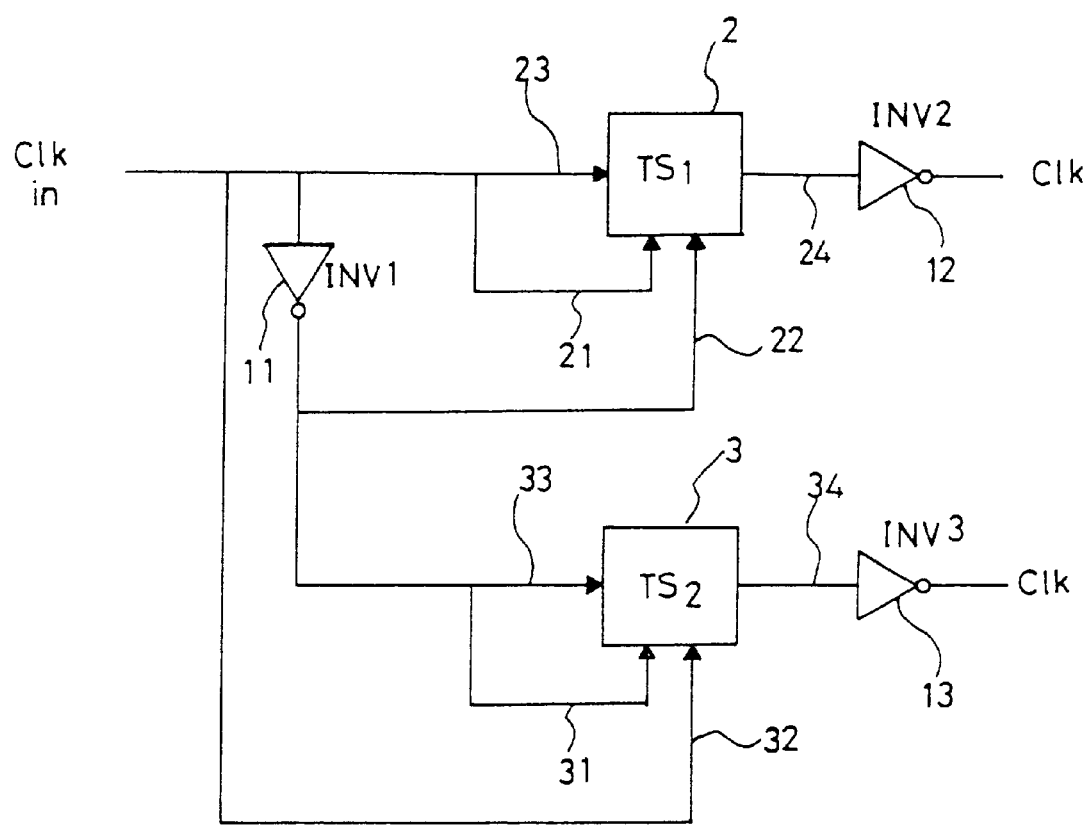
FIG. 2 is a block diagram illustrating the constitution of a CMOS complementary clock generator according to the present invention.

FIG. 2 is a block diagram illustrating a preferred embodiment of the present invention. A complementary clock generator according to the present invention includes a same-phase path and an opposite-phase path. The opposite-phase path includes second inverter Inv2 (12) and first transmitting switch TS1 (2) with its input terminal connected to receive input clock signal Clkin. The same-phase path includes first inverter Inv1 (11) connected to receive input clock signal Clkin and third inverter Inv3 (13) and second transmitting switch TS2 (3) connected to the output terminal of first inverter Inv1 (11).

First transmitting switch 2 includes first control input terminal 21 and second control input terminal 22. Input clock signal Clkin is connected to first control input terminal 21, while the input clock signal is inverted by first inverter 11 so as to be supplied to second control input terminal 22.

When the signal clocks are supplied to first control input terminal 21 and second control input terminal 22, first transmitting switch 2 connects the signals from input terminal 23 to output terminal 24.

Second transmitting switch 3 includes first control input terminal 31 and second control input terminal 32. Input clock signal Clkin is connected to second control input terminal 32, while the input clock signal inverted by first inverter 11 is supplied to first control input terminal 31. When signal clocks are supplied to first control input terminal 31 and second control input terminal 32, second transmitting switch 3 connects the supplied signals from input terminal 33 to output terminal 34.

A complementary clock generator of the present invention constituted as described above operates in the following manner.

First, input clock signal Clkin is supplied to input terminal 23 of first transmitting switch 2, to first control input terminal 21 of first transmitting switch 2, to first inverter 11, and to second control input terminal 32 of second transmitting switch 3. Signals are delayed for a short period of time passing through inverter Inv1, and the clock signals thus inverted are input into second control input terminal 22 of first transmitting switch 2, and into input terminal 33 and first control input terminal 31 of second transmitting switch 3.

When a first control input and a second control input are input, the first and second transmitting switches will output the input signals to the output terminals. Therefore, when the input clock signals reach the first and second transmitting switches after being delayed by the first inverter, the input clocks have already arrived. Therefore, the same-phase clock and the opposite-phase clock pass more simultaneously. These clocks are slightly delayed during the passing through the first and second transmitting switches, and are output through output terminals 24 and 34. Further, they pass through inverters Inv2 and Inv3 so as to be output as output clock signals /Clk and Clk. Therefore, if it is formed such that the clock signals should be transmitted through the same circuit elements within the first and second transmitting switches, then the two outputs are output more exactly at the same time. Thus if the simultaneously output clock pulse signals of the same- and opposite-phase pass through second inverter 12 and third inverter 13, respectively, then a more stabilized wave pattern is obtained.

Now a more specific embodiment of the present invention will be described referring to FIGS. 3 and 4.

Figure 3:
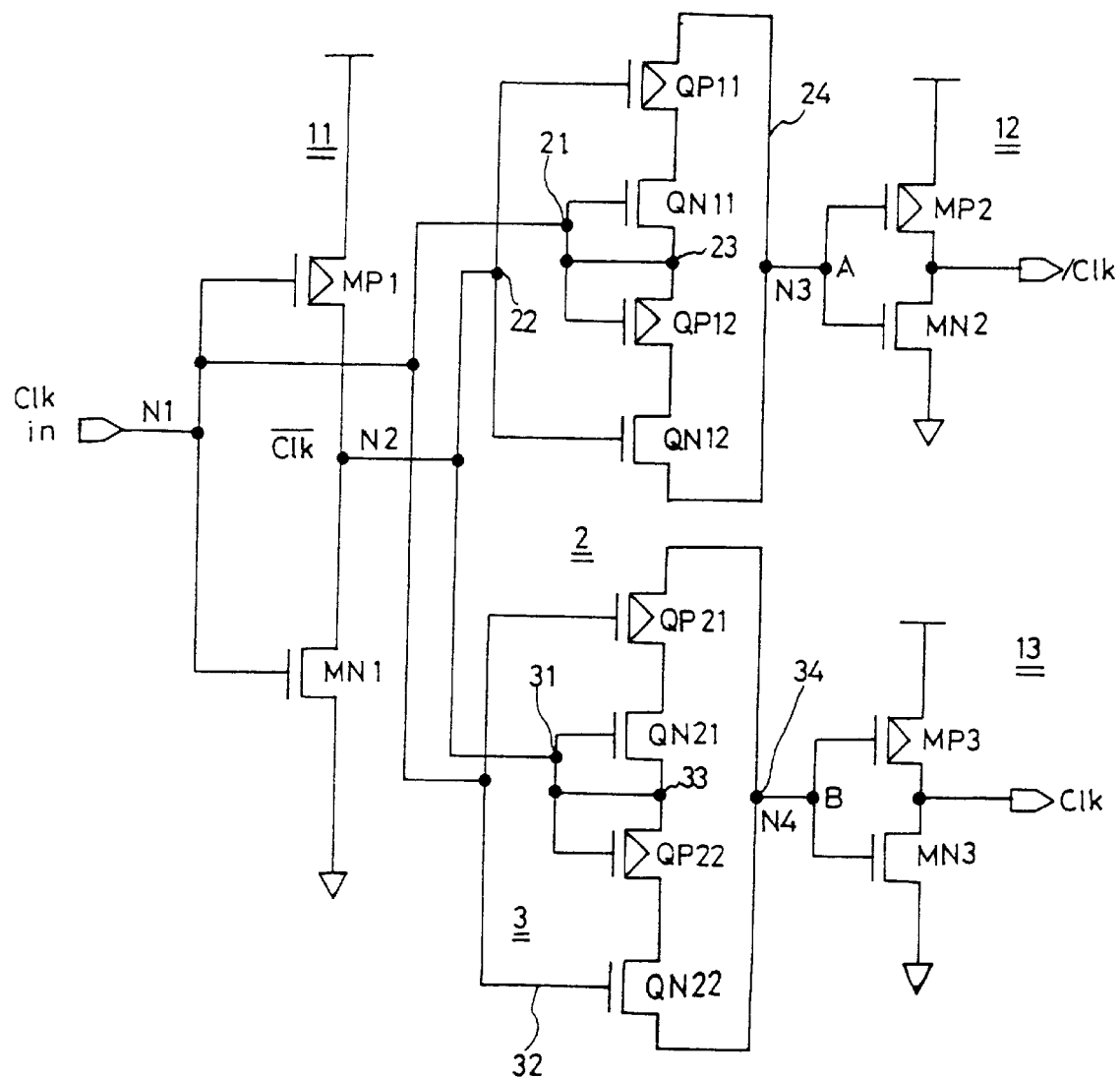
FIG. 3 illustrates circuits of a CMOS complementary clock generator according to the present invention.

As may be more clearly seen by comparing FIGS. 2 and 3, the first inverter of FIG. 2 includes PMOS transistor MP1 and NMOS transistor MN1 connected in series as illustrated. The gates of PMOS transistor MP1 and NMOS transistor MN1 are bound together so as for it to serve as an input terminal, while the sources/drains of PMOS transistor MP1 and NMOS transistor MN1 are connected to have the connection point serve as an output terminal as illustrated. The second inverter of FIG. 2 includes PMOS transistor MP2 and NMOS transistor MN2. The gates of PMOS transistor MP2 and NMOS transistor MN2 are bound together so as for it to serve as an input terminal, while the sources/drains of PMOS transistor MP2 and NMOS transistor MN2 are connected to have the connection point serve as an output terminal as illustrated. The third inverter of FIG. 2 includes PMOS transistor MP3 and NMOS transistor MN3. The gates of PMOS transistor MP3 and NMOS transistor MN3 are bound together so as for it to serve as an input terminal, while the sources/drains of PMOS transistor MP3 and NMOS transistor MN3 are connected to have the connection point serve as an output terminal as illustrated.

The first transmitting switch of FIG. 2 includes first PMOS transistor QP11, first NMOS transistor QN11, second PMOS transistor QP12 and second NMOS transistor QN12 connected in series. The drains of first PMOS transistor QP11 and second NMOS transistor QN12 are connected together so as for it to serve as output terminal (24) N3. The gates of first NMOS transistor QN11 and second PMOS transistor QP12 are connected together so as for it to serve as first control input terminal 21. The sources of first NMOS transistor QN11 and second PMOS transistor QP12 are connected together so as for it to serve as input terminal 23. The gates of first PMOS transistor QP11 and second NMOS transistor QN12 are connected together so as for it to serve as second control input terminal 22. Further, first control input terminal 21 and input terminal 23 are connected together.

The second transmitting switch of FIG. 2 includes first PMOS transistor QP21, first NMOS transistor QN21, second PMOS transistor QP22, and second NMOS transistor QN22 connected in series. The drains of first PMOS transistor QP21 and second NMOS transistor QN22 are connected together so as for it to serve as output terminal (34) N4. The gates of first NMOS transistor QN21 and second PMOS transistor QP22 are connected together so as for it to serve as first control input terminal 31. The sources of first NMOS transistor QN21 and second PMOS transistor QP22 are connected together so as for it to serve as input terminal 33. The gates of first PMOS transistor QP21 and second NMOS transistor QN22 are connected together so as for it to serve as second control input terminal 32. Further, first control input terminal 31 and input terminal 33 are connected together. In the preferred embodiment, the PMOS transistors of the transmitting switches are all formed of the same size, and the NMOS transistors of the transmitting switches also are formed of the same size.

The connections of the inverters and the transmitting switches are formed as illustrated in FIG. 2. That is, input clock signal Clkin is connected to input terminal 23 of the first transmitting switch, to first control input terminal 21 of the first transmitting switch, to input node N1 of first inverter 11, and to second control input terminal 32 of the second transmitting switch. Further, output terminal N2 of first inverter 11 is connected to second control input terminal 22 of the first transmitting switch, and to first control input terminal 31 and input terminal 33 of the second transmitting switch.

The complementary clock generator constituted as above will now be described as to its operations referring to FIGS. 3 and 4.

Figure 4:
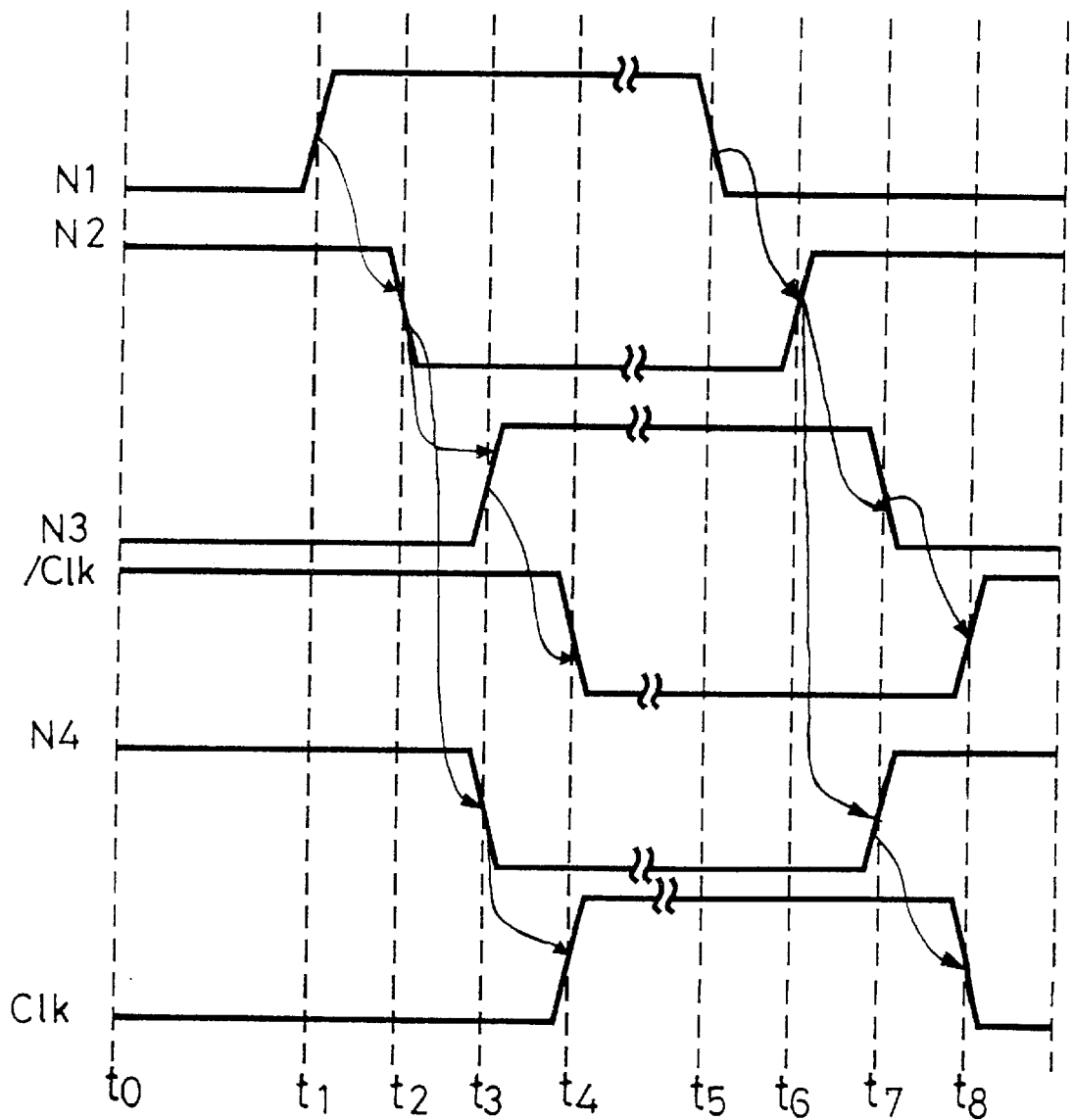
FIG. 4 is an operation timing chart for a CMOS complementary clock generator according to the present invention.

A description will be provided from moment t1 when the input clock signal rises from a low level to a high level as illustrated by wave pattern N1 of FIG. 4. NMOS transistor MN1 of first inverter 11 to which input pulse signal Clkin is directly supplied is turned on, while PMOS transistor MP1 is turned off. Thus at time t2, which arrives slightly later than time t1, output node N2 of the first inverter is shifted to a low level. Further, input clock signal Clkin turns on first NMOS transistor QN11 of the first transmitting switch at time t1, and at the same time turns off second PMOS transistor QP12, so as to make the electrical path ready. At the same time, a high clock signal is supplied to input terminal 23 of the first transmitting switch. The low level signal which has passed through the first inverter is supplied to the gates of first PMOS transistor QP11 and second NMOS transistor QN12 at time t2, thereby turning on first PMOS transistor QP11 and turning off second NMOS transistor QN12. Consequently, an input pulse signal which has been ready is transmitted through first NMOS transistor QN11 and first PMOS transistor QP11 to output node N3 of the first transmitting switch at time t3 so as to make it high.

At the same time, input clock signal Clkin turns off first PMOS transistor QP21 of the second transmitting switch at time t1 and turns on second NMOS transistor QN22 at time t1, thereby making the electrical path ready. Further, a low signal which has passed through the first inverter is supplied to the gates of second PMOS transistor QP22 and first NMOS transistor QN21, so as to turn on second PMOS transistor QP22 and to turn off first NMOS transistor QN21. Consequently, the electrical path which has been ready is made to be open, so that the signal (which has been formed by inverting the input pulse signal) of output terminal N2 would be supplied through second PMOS transistor QP22 and second NMOS transistor QN22 to output node N4 of the second transmitting switch at time t3, so as to make output node N4 low.

Thus the clock signals which have arrived at output nodes N3 and N4 pass through second inverter 12 and third inverter 13, respectively, at time t4 so as to be output as output clocks /Clk and Clk, respectively.

Under this condition, the time by which input clock signal Clkin arrives to the output nodes is as follows. That is, in the paths of the opposite and same phases, a time period as much as t2−t1 is commonly required in passing through first inverter 11. Further, in passing through first NMOS transistor QN11 and first PMOS transistor QP11 of the first transmitting switch, a time period as much as t3−t2 is required. Therefore, to arrive at output node N3 of the first transmitting switch, a time period as much as t3−t1 is required. The time consumed in passing through the second transmitting switch is as follows. That is, in passing through first inverter 11 by input clock signal Clkin, a time period as much as t2−t1 is commonly required. Further, in passing through second NMOS transistor QN22 and second PMOS transistor QP22, a time period as much as t3−t2 is required. Therefore, to arrive at output node N4 of the second transmitting switch, a time period as much as t3−t1 is required.

To observe the paths more closely, the time period for passing through the first inverter is the same in both the same- and opposite-phase paths. The time period for passing through the first transmitting switch, i.e., time period t3−t2 for passing through first NMOS transistor QN11 and first PMOS transistor QP11 is more exactly the same as the time period for passing through the second transmitting switch, i.e., time period t3−t2 for passing through second NMOS transistor QN22 and second PMOS transistor QP22.

The reason for this is as follows. That is, as to the paths of first NMOS transistor QN11 and first PMOS transistor QP11 of the first transmitting switch, and as to the paths of second NMOS transistor QN22 and second PMOS transistor QP22, the path of first NMOS transistor QN11 is the same as that of second NMOS transistor QN22, and the path of first PMOS transistor QP11 is the same as that of second PMOS transistor QP22.

The second inverter and the third inverter which are connected downstream have the same dimensions, and therefore, the delays provided by these inverters should be the same. Therefore, the final outputs, i.e., same-phase pulse signal Clk and opposite-phase pulse signal /Clk have a more perfect opposite relation.

The transmitting speed at the moment when the input pulse falls from a high state to a low state is also the same in both the same and opposite phases. That is, as illustrated in the wave patterns of FIG. 4, if input clock signal Clkin shifts from a high state to a low state at time t5, input clock signal Clkin directly turns off NMOS transistor MN1 of first inverter 11 and turns on PMOS transistor MP1 of first inverter 11. Consequently, output node N2 of the first inverter is shifted to a high state at time t6 slightly later than time t5.

Further, input pulse signal Clkin which has been shifted to a low state turns off first NMOS transistor QN11 and turns on second PMOS transistor QP12 at time t5, thereby making the electrical path ready. At the same time, a clock signal of a low state is supplied to input terminal 23 of the first transmitting switch.

Then the high signal which has passed through the first inverter is supplied to the gates of first PMOS transistor QP11 and second NMOS transistor QN12 at time t6, so that first PMOS transistor QP11 would be turned off, and that second NMOS transistor QN12 would be turned on. Consequently, an input pulse signal of a low state which has been ready is supplied through second NMOS transistor QN12 and second PMOS transistor QP12 to output node N3 of the first transmitting switch at time t7, thereby putting the output node to a low state.

At the same time, input clock signal Clkin turns on first PMOS transistor QP21 of the second transmitting switch and turns off second NMOS transistor QN22 of the second transmitting switch at time t5, so as to make the electrical path ready. Further, a signal of a high state which has passed through the first inverter is supplied to the gates of second PMOS transistor QP22 and first NMOS transistor QN21 at time t6, so that second PMOS transistor QP22 would be turned off, and that first NMOS transistor QN21 would be turned on. Consequently, the path which has been ready is made to be open, and therefore, a signal of output node N2, i.e., a signal which is formed by inverting the input pulse signal is supplied through first PMOS transistor QP21 and first NMOS transistor QN21 to output node N4 of the second transmitting switch at time t7, thereby making the output node high.

Thus the clock signals which have arrived at output nodes N3 and N4 pass simultaneously through second inverter 12 and third inverter 13 to be output as output clocks /Clk and Clk, respectively.

Under this condition, the time by which input clock signal Clkin arrives to the output nodes is as follows. That is, in the paths of the opposite phase and the same phase, a time period as much as t6–t5 is commonly required in passing through first inverter 11. Further, in passing through second NMOS transistor QN12 and second PMOS transistor QP12 of the first transmitting switch, a time period as much as t7–t6 is required. Therefore, to arrive at output node N3 of the first transmitting switch, a time period as much as t7–t5 is required.

The time consumed in passing through the second transmitting switch is as follows. In passing through first NMOS transistor QN21 and first PMOS transistor QP21, a time period as much as t7–t6 is required. Therefore, to arrive at output node N4 of the second transmitting switch, a time period as much as t7–t5 is required. Therefore, the delay is the same in both the same-phase path and the opposite-phase path.

The time period for passing through the first transmitting switch, i.e., time period t7–t6 for passing through second NMOS transistor QN12 and second PMOS transistor QP12 is exactly the same as the time period for passing through the second transmitting switch, i.e., time period t7–t6 for passing through first NMOS transistor QN21 and first PMOS transistor QP21.

As a result, the paths for generating output clocks Clk and /Clk cause a delay during the passing of the signals through one inverter, one transmitting switch having a PMOS transistor and an NMOS transistor, and another inverter. Therefore, the two output clocks have a perfect symmetry thereby forming a complementary clock.

According to the present invention as described above, the two clocks pass through the same number of transistors, and, therefore, W/L ratios of the transistors do not have to be controlled so tightly for making the cross point to 50%. That is the paths through which the two clocks pass have a symmetrical shape, and their operations also are symmetrical. Therefore, compared with the conventional asymmetrical paths, the matching is much easier. Therefore, the designing is easier, and once a matching is realized, the characteristics become stable in spite of variations of the manufacturing process and other parameters, thereby providing a good matching-operating-conditions tolerance.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A complementary clock generator comprising:
   a first inverter for outputting an inverted clock signal by inverting an input clock signal;
   a first transmitting switch having an input terminal for receiving the input clock signal, an output terminal, a first control input terminal and a second control input terminal, the first transmitting switch connecting the input terminal of the first transmitting switch to the output terminal of the first transmitting switch when the input clock signal reaches the first control input terminal of the first transmitting switch and the inverted clock signal output by the first inverter reaches the second control input terminal of the first transmitting switch; and
   a second transmitting switch having an input terminal for receiving the inverted clock signal, an output terminal, a first control input terminal and a second control input terminal, the second transmitting switch connecting the input terminal of the second transmitting switch to the output terminal of the second transmitting switch when the inverted clock signal output by the first inverter reaches the first control input terminal of the second transmitting switch and the input clock signal reaches the second control input terminal of the second transmitting switch, wherein a first clock signal in-phase with the input clock signal is provided on the output terminal of the first transmitting switch, and a second clock signal complementary to the first clock signal is simultaneously provided on the output terminal of the second transmitting switch.

2. The complementary clock generator as claimed in claim 1, wherein:
   a second inverter is coupled to the output terminal of the first transmitting switch; and
   a third inverter is coupled to the output terminal of the second transmitting switch;
   wherein an opposite-phase clock signal is provided at an output terminal of the second inverter, and a same-phase clock signal is provided at an output terminal of the third inverter.

3. The complementary clock generator as claimed in claim 1, wherein each of the first and second transmitting switches comprises:

a first PMOS transistor, a first NMOS transistor, a second PMOS transistor, and a second NMOS transistor coupled in series;

wherein drains of the first PMOS transistor and the second NMOS transistor are coupled together so as to serve as the output terminal;

wherein gates of the first NMOS transistor and the second PMOS transistor are coupled together so as to serve as the first control input terminal;

wherein sources of the first NMOS transistor and the second PMOS transistor are coupled together so as to serve as the input terminal; and wherein gates of the first PMOS transistor and the second NMOS transistor are coupled together so as to serve as the second control input terminal.

4. The complementary clock generator as claimed in claim 1, wherein the first transmitting switch comprises:

a first PMOS transistor, a first NMOS transistor, a second PMOS transistor, and a second NMOS transistor coupled in series;

wherein drains of the first PMOS transistor and the second NMOS transistor are coupled together so as to serve as the output terminal of the first transmitting switch;

wherein gates of the first NMOS transistor and the second PMOS transistor are coupled so as to serve as the first control input terminal of the first transmitting switch;

wherein sources of the first NMOS transistor and the second PMOS transistor are coupled together so as to serve as the input terminal of the first transmitting switch; and wherein gates of the first PMOS transistor and the second NMOS transistor are coupled together so as to serve as the second control input terminal of the first transmitting switch; and the second transmitting switch comprises:

a third PMOS transistor, a third NMOS transistor, a fourth PMOS transistor, and a fourth NMOS transistor coupled in series;

wherein drains of the third PMOS transistor and the fourth NMOS transistor are coupled together so as to serve as the output terminal of the second transmitting switch;

wherein gates of the third NMOS transistor and the fourth PMOS transistor are coupled together so as to serve as the first control input terminal of the second transmitting switch;

wherein sources of the third NMOS transistor and the fourth PMOS transistor are coupled together so as to serve as the input terminal of the second transmitting switch; and wherein gates of the third PMOS transistor and the fourth NMOS transistor are coupled together so as to serve as the second control input terminal of the second transmitting switch.

5. The complementary clock generator as claimed in claim 2, wherein the first, second and third inverters comprise CMOS inverters.

6. The complementary clock generator as claimed in claim 2, wherein:

the first PMOS transistor has a channel width and channel length that is the same as the second PMOS transistor, and the first NMOS transistor has a channel width and channel length that is the same as the second NMOS transistor.

7. A complementary clock generator comprising:

an inversion means for inverting an input clock signal to provide an inverted clock signal;

a first transmitting switch adapted to receive the input clock signal and the inverted clock signal and to provide an output clock signal, wherein the input clock signal is transferred to the output clock signal through an electrical path in the first transmitting switch controlled by the input clock signal and the inverted clock signal; and a second transmitting switch adapted to receive the input clock signal and the inverted clock signal and to provide a complementary output clock signal, wherein the inverted input clock signal drives the complementary output clock signal through an electrical path in the second transmitting switch controlled by the inverted clock signal and the input clock signal.

8. The complementary clock generator as in claim 7, wherein the first transmitting switch comprises:

a first transistor pair coupled in series; and a second transistor pair coupled in series, the second transistor pair coupled in series with the first transistor pair, wherein a first node coupling the first and second transistor pairs is adapted to receive the input clock signal, wherein a second node coupling the first and second transistor pairs is adapted to provide the output clock signal.

9. The complementary clock generator as in claim 8, wherein each of the first and second transistor pairs comprises an NMOS transistor and a PMOS transistor.

10. The complementary clock generator as in claim 8, wherein the input clock signal controls the transition of the output clock signal, wherein the input clock signal controls the transition of the complementary output clock signal.

* * * * *